(12) United States Patent
Apel

(10) Patent No.: US 7,026,910 B2
(45) Date of Patent: Apr. 11, 2006

(54) GMR MODULE

(75) Inventor: Peter Apel, Suedkirchen (DE)

(73) Assignee: AB Electronik GmbH, Werne (DE)

( * ) Notice: Subject to any disclaimer, the term of this patent is extended or adjusted under 35 U.S.C. 154(b) by 494 days.

(21) Appl. No.: 10/191,578

(22) Filed: Jul. 8, 2002

(65) Prior Publication Data

US 2003/0165719 A1 Sep. 4, 2003

(30) Foreign Application Priority Data

Jul. 7, 2001 (DE) .............................. 101 33 123

(51) Int. Cl.
*H01L 43/00* (2006.01)
(52) U.S. Cl. .................. 338/32 R; 338/32 S
(58) Field of Classification Search ............. 338/32 R, 338/32 S; 361/811, 763, 766
See application file for complete search history.

(56) References Cited

U.S. PATENT DOCUMENTS

| | | | | |
|---|---|---|---|---|
| 3,496,283 A | * | 2/1970 | Andrasfay | .................. 174/267 |
| 3,852,103 A | * | 12/1974 | Collins et al. | ............. 338/32 R |
| 3,932,017 A | * | 1/1976 | Dechelette | ................... 439/830 |
| 4,224,594 A | * | 9/1980 | Anthony et al. | .......... 338/32 R |
| 4,779,164 A | * | 10/1988 | Menzies et al. | ............. 361/734 |
| 5,387,814 A | * | 2/1995 | Baudouin et al. | ........... 257/690 |
| 5,631,557 A | * | 5/1997 | Davidson | .................... 324/174 |
| 5,818,223 A | * | 10/1998 | Wolf | ....................... 324/207.12 |
| 5,929,729 A | * | 7/1999 | Swarup | ...................... 333/246 |
| 6,072,311 A | * | 6/2000 | Shinjo et al. | ................ 324/174 |
| 6,110,609 A | * | 8/2000 | Hiramoto et al. | ........... 428/692 |
| 6,163,460 A | * | 12/2000 | Baur et al. | ................... 361/752 |
| 6,204,662 B1 | * | 3/2001 | Shinjo et al. | ................ 324/252 |
| 6,206,719 B1 | * | 3/2001 | Tsunezawa et al. | ......... 439/395 |
| 6,429,498 B1 | * | 8/2002 | Schelten et al. | ............ 257/421 |
| 6,501,270 B1 | * | 12/2002 | Opie | .......................... 324/251 |
| 6,713,836 B1 | * | 3/2004 | Liu et al. | ..................... 257/528 |

* cited by examiner

*Primary Examiner*—Tu Hoang
(74) *Attorney, Agent, or Firm*—Milde & Hoffberg, LLP

(57) ABSTRACT

So that the parts and connections of a component, particularly a Giant Magneto-Resistor, may withstand external forces, a meander group (13M, 14M) with at least one meander element (13.1, . . . , 13.n, 14.1, . . . , 14.n) is positioned in both connection elements (13, 14) between a component cell (1) and the straight functional connection element (13A, 14A). A capacitor unit (2) is mounted on the meander group (13M) of the first connection element (13) and on the meander group (14M; of the second connection element (14).

11 Claims, 1 Drawing Sheet

GMR MODULE

BACKGROUND OF THE INVENTION

The invention relates to a component, particularly a Giant Magnet-Resistor device, consisting of at least A component cell that includes at least two connection elements that end in an essentially straight function connection element, and A capacitor unit mounted on both connection elements.

A Giant Magnet-Resistor (GMR) module consists of a GMR cell with two essentially straight connection elements. A capacitor is connected to both connection elements.

The disadvantage is that this connection system, particularly during connection of the straight connection elements with other parts and elements of the overall system with other parts and elements, is subjected to forces that may lead to destruction of the connections or of parts of the connection system. Since the GMR cell is relatively small geometrically, it may be the first active element to be destroyed.

SUMMARY OF THE INVENTION

The object of the present invention is therefore further to develop a component, particularly a Giant Magnet-Resistor (GMR) module, of the type described above so that its parts and connections may withstand external mechanical forces.

This object is achieved by the invention in that:

A meander group with at least one meander element is positioned in both first and second connection elements between the component cell and the straight function connection element, and The capacitor is positioned on the meander group of the first connection element and on the meander group of the second connection element.

The advantages achieved by the intention particularly consist of the fact that mechanical decoupling is provided by the meander groups. This mechanical decoupling occurs first in the connection elements, and second, between the elements. Thus, the mechanical loading of the GMR unit is avoided. This prevents the occurrence of cracks. The individual meander elements of the meander group in the connection elements relieve the length alterations that may arise in automobiles under temperature loads between minus 40° C. and plus 160° C.

The capacitor unit may be soldered onto the meander group of the first and the second connection elements. A solder connection is a very effective and low-cost connection.

The meander elements may be rectangular, sinusoidal, or sawtooth shaped, or in the form of a damped oscillation curve. In principle, all serpentine shapes such as rectangular, sinusoidal, or sawtooth provide the meander element with the same mechanical decoupling. The meander elements may also be in the form of slotted and drawn sheet metal elements similar to a rib mesh, which is also capable of providing mechanical decoupling.

An expansion section may be positioned between the meander group and the component cell in the first and the second connection element. The expansion section may be a step-shaped bend or of any other suitable telescopic configuration. On the one hand, the expansion section contributes to further mechanical decoupling. Moreover, it ensures a properly positioned connection between the component cell and the capacitor unit. One should mention at this point that another a resistor or other passive component might be used here instead of a capacitor unit.

The two connection elements may have a rectangular, triangular, circular, or a similar cross-sectional shape. The shape of the connection elements used depends on the specific installation and manufacturing operations involved.

The component cell may be a Giant Magneto-Resistor cell. The component cell may also be a cell containing a component of another shape.

The Giant Magneto-Resistor cell may include a semiconductor strip with needles and/or short-circuiting rasters. It may, however, be otherwise shaped.

For a full understanding of the present invention, reference should now be made to the following detailed description of the preferred embodiments of the invention as illustrated in the accompanying drawings.

DESCRIPTION OF THE PREFERRED EMBODIMENTS

Figure 2:
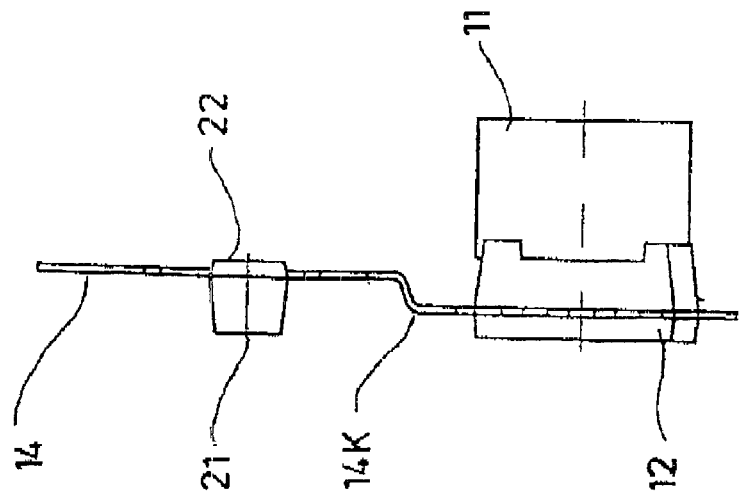
FIG. 2 a GMR module as in FIG. 1 in a schematic lateral view.

The preferred embodiments of the present invention will now be described with reference to FIGS. 1 and 2 of the drawings. Identical elements in the various figures are designated with the same reference numerals.

Figure 1:
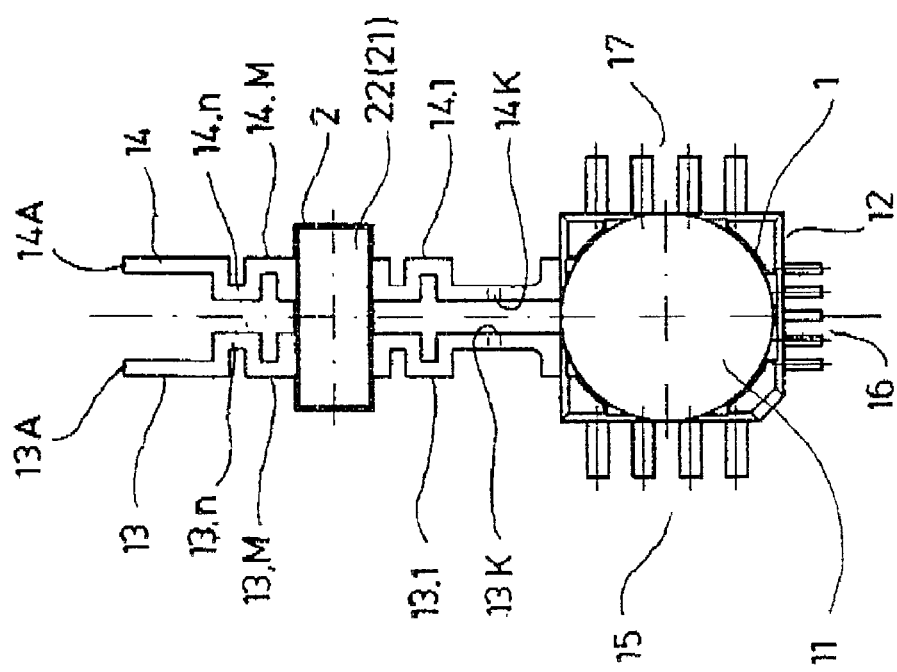
FIG. 1 A GMR module in a schematic overhead view.

As FIGS. 1 and 2 show, a GMR module consists of:

A Giant Magneto-Resistor (GMR) cell 1, and

A capacitor unit 2.

The GMR cell 1 includes a GMR housing element 12, on which a GMR element is mounted. The GMR element is a magnetic resistor with reluctance $R_m$. In a magnetic circuit, the reluctance is the quotient of the magnetic voltage V divided by the magnetic flux $\varphi$, i.e.:

$$R_m = \frac{V}{\varphi}$$

The inverse value of the magnetic resistance is denoted as magnetic conductance $\Lambda$.

The magnetic resistor, also known as a magneto-resistor (field plate), is used to achieve high signal voltage levels under low-current conditions. With such a component, one is challenged to make the relative resistance alteration as large as possible, and to make these resistors with the minimum surface area possible.

The Hall effect that prevents achievement of high resistance alterations within a magnetic field may be almost completely eliminated by the insertion of InSb needles into the InSb crystal (self-conducting or dosed), or by the inclusion of a short-circuiting grid onto a homogenic InSb crystal. Another option to overcome the Hall effect is the use of a round disk making contact at its center and about its circumference (corbinodisk).

Two connection elements 13, 14 extend essentially parallel to each other from the GMR housing 12.

An expansion section 13K, 14K is formed in each connection element directly adjacent the GMR housing element. The expansion section may be essentially step-shaped. It may also be formed into each connection element as $\Omega$-shaped, V-shaped, or any similar element configuration which permits telescoping of the leads.

A meander group 13.n, 14.n consisting of individual meander elements 13.1, . . . , 13.n, 14.1, . . . , 14.n is included in both connection elements 13, 14 after the expansion section of each. As shown in FIG. 1 each meander element has a serpentine or zig-zag shape.

A meander group 13.n, 14.n consisting of individual meander elements 13.1, . . . , 13.n, 14.1, . . . , 14.n is included in both connection elements 13, 14 after the expansion loop element.

As FIG. 1 particularly shows, the two connection elements are made of a strap-rail material. The individual meander elements 13.1, . . . , 14.1, . . . are formed as a square wave in the connection elements thus shaped. Each meander group includes six meander elements 13.1, . . .

After the two shaped meander groups 13M, 14M, the connection elements 13, 14 continue in a function connection element 13A extending straight. Connection with other components, circuit units, or similar devices is established to the essentially linear shaped function connection elements.

The capacitor unit 2 is positioned on the two opposing meander groups 13M, 14M of the two connection elements 13, 14.

The capacitor unit 2 includes a capacitor connection element 12 on which a capacitor element 21 is mounted. The connection between the capacitor unit 2 and the two connection elements is performed in such a manner that the meander groups 13M, 14M are supported by the capacitor connection element 12 and the capacitor element 21 on top of it.

As FIG. 2 particularly shows, the expansion loop element 13K, 14K is so shaped that the lower edge of the GMR housing element 12 and the lower edge of the capacitor element 21 are co-planar. Thus, the GMR module may be installed in a proper position.

The GMR housing element 12 is essentially rectangular shaped. A connector group may be positioned on at least one of the free faces. In FIG. 2, a connector group 15, a connector group 16 and a connector group 17 are mounted on the three free faces.

As soon as the GMR module is installed, it is subject to thermal loading. Operating temperatures may vary between minus 40 and plus 160° C. At these extreme temperature differentials, the position and length of the materials change. An effective mechanical decoupling of the very sensitive GMR cell 1 is provided by the meander groups 13M, 14M. Since the individual meander elements 13.1, . . . , 14.1, . . . absorb the forces caused by alteration in length, the sensitive GMR cell is protected. This ensures that it may positively perform its function in any circuit configuration.

There has thus been shown and described a novel GMR module which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. In an electronic circuit device comprising:
   (a) a component cell;
   (b) two self-supporting connection elements, each having first and second ends, said first ends being connected to said component cell and said second ends being adapted for connection to another electronic circuit device; and
   (c) a passive circuit component that is positioned on, and coupled to, both connection elements, the improvement wherein said connection elements each have formed therein a meander group with a first meander portion between the component cell and the circuit component and a second meander portion between said circuit component and said second end thereof, wherein the meander portions mechanically decouple the respective connection elements.

2. Device as in claim 1, wherein the circuit component is soldered onto the first and the second connection elements in the region of their respective meander groups.

3. Device as in claim 1, wherein the meander portions have a shape selected from the group consisting of rectangular, sinusoidal, sawtooth and a damped oscillation curve.

4. Device as in claim 1, wherein an expansion section is positioned between the first meander portion and the component cell in the first and the second connection element.

5. Device as in claim 1, wherein each expansion section is of telescoping configuration.

6. Device as in claim 1, wherein both connection elements have a cross-sectional shape selected from the group consisting of rectangular, triangular, and circular.

7. Device as in claim 1, wherein the component cell is a Giant Magneto-Resistor.

8. Device as in claim 7, wherein the Giant Magneto-Resistor cell includes a semiconductor strip with at least one of needles and short-circuiting grids.

9. Device as in claim 1, wherein the circuit component is a capacitor.

10. Device as in claim 1, wherein the circuit component is a resistor.

11. Device as in claim 1, wherein the form of each expansion section is selected from the group consisting of a step shape, an Ω-shape and a V shape.

* * * * *